United States Patent [19]
Morgan

[11] Patent Number: 5,949,088
[45] Date of Patent: Sep. 7, 1999

[54] INTERMEDIATE SRAM ARRAY PRODUCT AND METHOD OF CONDITIONING MEMORY ELEMENTS THEREOF

[75] Inventor: Donald M. Morgan, Boise, Id.

[73] Assignee: Micron Technology, Inc., Boise, Id.

[21] Appl. No.: 08/738,061

[22] Filed: Oct. 25, 1996

[51] Int. Cl.⁶ .......................... H01L 19/00; G11C 13/00
[52] U.S. Cl. ............................ 257/5; 257/48; 257/390
[58] Field of Search ............................. 257/2, 3, 4, 5, 257/390, 48

[56] References Cited

U.S. PATENT DOCUMENTS

| | | | |
|---|---|---|---|
| 3,629,863 | 12/1971 | Neale | 257/2 |
| 3,877,049 | 4/1975 | Buckley | 257/4 |
| 4,499,557 | 2/1985 | Holmberg et al. | 365/163 |
| 5,341,328 | 8/1994 | Ovshinsky et al. | 365/163 |
| 5,396,454 | 3/1995 | Nowak | 365/154 |
| 5,414,271 | 5/1995 | Ovshinsky et al. | 257/3 |
| 5,471,421 | 11/1995 | Rose et al. | 365/182 |
| 5,596,522 | 1/1997 | Ovshinsky et al. | 365/113 |
| 5,751,012 | 5/1998 | Wolstenholme et al. | 257/4 |

Primary Examiner—Donald L. Monin, Jr.
Attorney, Agent, or Firm—Dickstein Shapiro Morin & Oshinsky LLP

[57] ABSTRACT

An intermediate semiconductor product in a semiconductor fabrication process. The intermediate semiconductor product comprises an array of memory cells on a semiconductor substrate, where each cell includes an access device having an active semiconductor region and a memory element positioned in ohmic contact with the active semiconductor region. The intermediate semiconductor product further comprises a first wiring commonly connected to the memory element of each memory cell; and a second wiring commonly connected to the active semiconductor region of each memory cell, whereby, upon application of a voltage across the first and second wirings, conditioning current may flow in parallel through the memory elements to concurrently condition a programmable memory characteristic of the memory elements. A fabricating method is also provided. The method comprises the steps of forming an array of devices on a substrate, each device including first and second components, the first component having a first side and a second side electrically connected in series circuit with the second component at a node; applying a first wiring over the cells in electrical circuit connection with the first sides of the first components; applying a second wiring over the cells in electrical circuit connection with the nodes; and applying a voltage across the first and second wirings to produce parallel conditioning current flows through the first components and bypassing the second components; and removing the second wiring.

10 Claims, 3 Drawing Sheets

INTERMEDIATE SRAM ARRAY PRODUCT AND METHOD OF CONDITIONING MEMORY ELEMENTS THEREOF

This invention was made with Government support under Contract No. MDA972-92-C-0054 awarded by the Advanced Research Projects Agency (ARPA). The Government has certain rights in this invention.

The present invention relates Random Access memories (RAMs), and particularly to Static Random Access Memories (SRAMs) and a method for conditioning memory elements thereof during memory array fabrication.

BACKGROUND OF THE INVENTION

DRAM integrated circuit arrays have existed for more than twenty five years and have evolved from the earliest one kilobit (Kb) generation to the recent 256 megabit (Mb) generation. This dramatic increase in storage capacity has been achieved through advances in semiconductor fabrication technology and circuit design technology. The tremendous advances in these two technologies have also achieved higher and higher levels of integration that permit dramatic reductions in memory array size and cost, as well as increased process yield.

A DRAM memory cell typically comprises, as basic components, an access transistor (switch) and a capacitor for storing a binary data bit in the form of a charge. Typically, a charge of one polarity is stored on the capacitor to represent a binary ONE, and a stored charge of the opposite polarity represents a binary ZERO. The basic drawback of a DRAM is that the charge on the capacitor eventually leaks away and therefore provisions must be made to "refresh" the capacitor charge or else the data bit stored by the memory cell is lost.

The memory cell of a conventional SRAM, on the other hand, comprises, as basic components, an access transistor or transistors and a memory element in the form of two or more integrated circuit devices interconnected to function as a bistable latch. An example of such a bistable latch is cross-coupled inverters. Bistable latches do not need to be "refreshed", as in the case of DRAM memory cells, and will reliably store a data bit indefinitely as long as they continue to receive supply voltage.

Efforts continue to identify other forms of memory elements for use in SRAMs. Recent studies have focused on resistive materials that can be programmed to exhibit either high or low stable ohmic states. A memory element of such material could be programmed (set) to a high resistive state to store, for example, a ONE data bit or programmed to a low resistive state to store a ZERO data bit. The stored data bit could then be retrieved by detecting the magnitude of a readout current switched through the resistive memory element by an access device, thus indicating the stable resistance state it had previously been programmed to.

A known programmable, bistable resistive material is chalcogenide, as disclosed in Ovshinsky et al., U.S. Pat. No. 5,414,271, the disclosure of which is incorporated herein by reference. Typical chalcogenide compositions for memory elements include average concentrations of Te in the amorphous state well below 70%, typically below about 60% and ranging in general from as low as about 23% up to about 56% Te and most preferably to about 48% to 56% Te. Concentrations of Ge are typically above about 15% and range from a low of about 17% to about 44%, but remaining generally below 50% Ge, with the remainder of the principal constituent elements in this class being Sb. The percentages given are atomic percentages, which total 100% of the atoms of the constituent elements. This class of materials is typically characterized as $Te_a Ge_b SB_{100-(a+b)}$, where a is equal to or less than about 70% and preferably between about 60% to about 40%, b is above about 15% and less than 50%, preferably between about 17% to about 44% and the remainder is Sb.

A memory element comprised of chalcogenide material can be programmed to a stable high resistive state by passing a narrow, high amplitude current pulse through it. A lower amplitude current pulse of longer duration programs the chalcogenide memory element to a stable, low resistive state. The chalcogenide memory element is simply written over by the appropriate current pulse to reprogram it, and thus does not need to be erased. Moreover, the memory element of chalcogenide material is nonvolatile, in that it need not be connected to a power supply to retain its programmed high or low resistive state.

It has, however, been discovered that a chalcogenide material, once formed as memory elements suitable for integration into an SRAM matrix array, must be electrically conditioned in order to optimize memory element characteristics, basically with regard to reducing the levels and durations of the current pulses required to reprogram it. One suitable conditioning process has been found to involve passing a conditioning current of varying amplitude through the memory elements.

Unfortunately, the conditioning voltage and current magnitudes, required to render the chalcogenide memory elements optimally programmable, exceed the current carrying capacities of SRAM components, such as the memory cell access transistors. Thus, conditioning the memory elements can not utilize the read/write access circuitry of the finished SRAM that would necessarily require the access transistors to conduct the conditioning current. The problem then becomes how to condition the resistive memory elements of the multitude of memory cells of an SRAM matrix array in a cost effective manner without involving memory cell access circuitry, particularly the access transistors.

SUMMARY OF THE INVENTION

The present invention is directed to an intermediate semiconductor product in a semiconductor fabrication process, comprising a semiconductor substrate, an array of memory cells, each memory cell including an access device having an active semiconductor region formed in the substrate, and a memory element positioned in ohmic contact with the active semiconductor region. The intermediate semiconductor product further comprises a first wiring commonly connected to the memory element of each memory cell; and second wiring commonly connected to the access device active semiconductor region of each memory cell, whereby, upon application of a voltage across the first and second wirings, conditioning current may flow in parallel through the memory elements to concurrently condition a programmable memory characteristic of the memory elements.

The present invention is also directed to a semiconductor fabricating method comprising the steps of forming an array of devices on a substrate, each device including first and second components, the first component having a first side and a second side electrically connected in series circuit with the second component at a node; applying a first wiring over the cells in electrical circuit connection with the first sides of the first components; applying a second wiring over the cells in electrical circuit connection with the nodes; and applying a voltage across the first and second wirings to produce parallel conditioning current flows through the first components and bypassing the second components; and removing the second wiring.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DETAILED DESCRIPTION OF THE INVENTION

Reference will now be made in detail to the present preferred embodiments of the invention, examples of which are illustrated in the accompanying drawings. Wherever possible, the same reference numbers will be used throughout the drawings to refer to the same or like parts.

Figure 1:
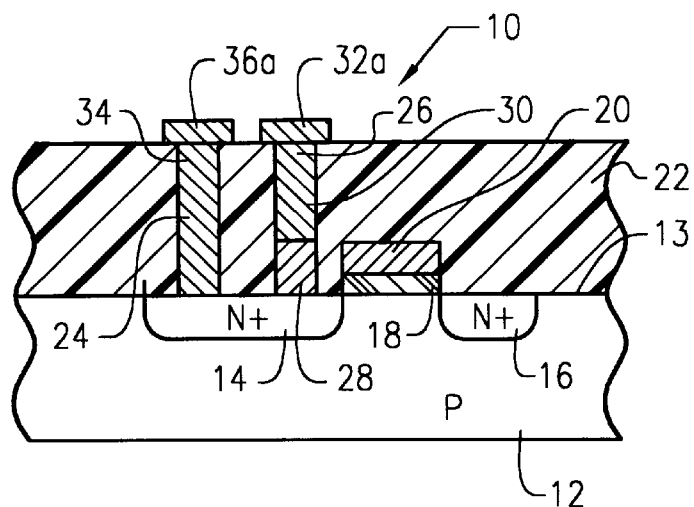
FIG. 1 is a fragmentary sectional view of one memory cell of a matrix array in a form existing at an intermediate stage of an SRAM fabrication process.

In the fragmentary sectional view of FIG. 1, a memory cell of a Static Random Access Memory (SRAM) matrix array is illustrated in its form existing at an intermediate stage of a SRAM fabrication process. However, elements of the memory cell that may exist at the intermediate process stage of interest, but are not relevant to a full description of the present invention, have been omitted from FIG. 1 for the sake of brevity.

Thus, insofar as is relevant to the present invention, the memory cell, generally indicated by reference numeral 10 in FIG. 1, includes a P semiconductor substrate 12 having a primary plane as surface 13 into which laterally spaced N+ active regions 14 and 16 have been formed by the diffusion of appropriate dopants. Spaced above substrate surface 13 by a silicon oxide film 18 at a position over the gap between active regions 14 and 16 is a gate 20 of an MOS transistor that will serve as memory cell access device or switch in the final SRAM product. Since the operation of MOS transistors to access SRAM memory cells is well understood in the art, elements necessary to perform this function have been omitted in FIG. 1.

Overlying the substrate surface and gate 20 is a silicon oxide film 22 that includes a pair of side-by-side holes or contact windows 24 and 26 that expose separate surface portions of active region 14. In the bottom of contact window 26, a chalcogenide memory element 28 in the form of a plug is positioned in ohmic contact with active region 14, which serves as either the source or drain of the MOS transistor access device. The remainder of contact window 26 above memory element is filled by an electrode 30. The lower end of this electrode is electrically connected to the upper end of memory element 28, while its upper end electrically contacts a branch line 32a of a comb-shaped metal wiring, generally indicated at 32 in FIG. 2. In the final SRAM product, branch lines 32a may serve as digit lines of the matrix array read/write circuitry. Contact window 24 receives an electrode 34, whose lower end ohmically contacts active region 14 and upper end ohmically contacts a branch line 36a of a comb-shaped metal wiring, generally indicated at 36 in FIG. 2.

Figure 2:
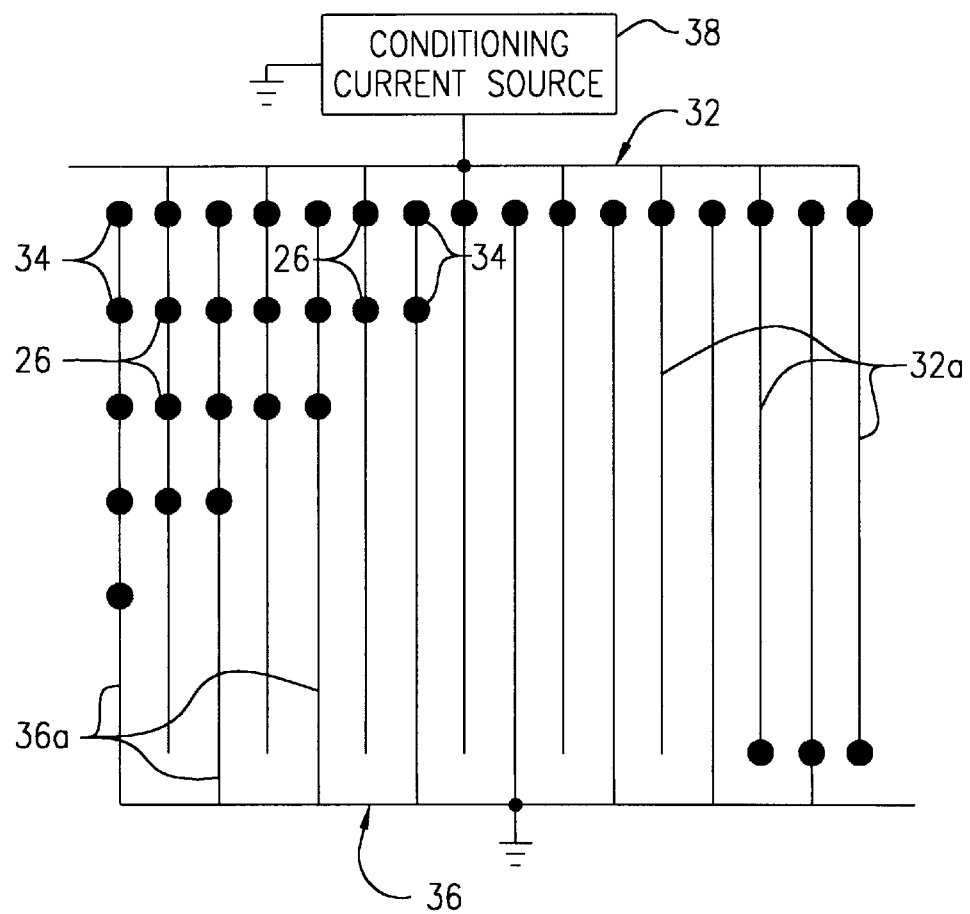
FIG. 2 is a simplified plan view of an SRAM at the process stage represented by FIG. 1, with circuit connections made to electrically condition memory cell elements.

As can be seen in FIG. 2, each branch line 32a contacts a different row of electrodes 26, while each branch line 36a contacts a different row of electrodes 34. Corresponding ends of branch lines 32a are connected in common to a source 38 of conditioning current, and corresponding ends of branch lines 36a are connected in common to ground. Consequently, when the voltage of source 38 is applied across metal wirings 32,36, conditioning current flows between the metal wirings through all of the chalcogenide memory elements 28 of the SRAM matrix array in parallel to simultaneously condition the memory elements of the entire array to optimum programmability. It will be noted, that the conditioning current path through each memory cell, while including active region 14 as a node between memory element 28 and the access device, otherwise bypasses the memory cell access device. In the illustrated example of a MOS transistor access device, the conditioning current is shunted from the inversion channel region between beneath gate 26 and extending between active regions 14 and 16, which conducts memory element read/write currents during SRAM operation. Thus, the MOS transistors and particularly their channel regions are not subjected to the potentially damaging conditioning currents, which are necessarily of higher magnitudes than the read/write (programming) currents seen in practice.

Once the chalcogenide memory elements 28 have been conditioned, metal wirings 32 and 36 are removed. However, it may be possible to utilize at least the branch lines 32a in the memory cell access circuitry of the final SRAM product, in which case, only wiring 36 and the branch connecting portions of wiring 32 need be removed. Rather than completely remove wiring 36, it may be appropriately interrupted to prevent current flow into the wiring 36 from the memory elements 28 during SRAM operation. Alternatively, wiring may be notched by a selective etching process to eliminate (open) its electrical contacts with electrodes 34.

Figure 3A:
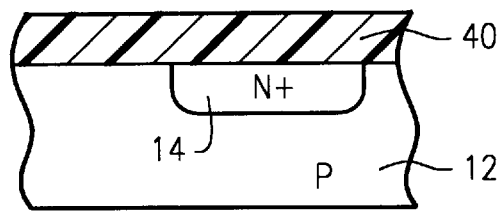
FIGS. 3a–3j are a series of fragmentary sectional views illustrating fabrication process steps performed to achieve the memory cell structure illustrated in FIG. 1.

FIGS. 3a–3j illustrate exemplary steps in a SRAM fabrication process that relate to the formation of the chalcogenide memory elements 28, electrodes 30, 34, metal wirings 32 and 36. For the sake of simplicity the process steps are illustrated in the figures with respect to one memory cell only. Thus, as seen in FIG. 3a, an oxide layer 40 is deposited on the substrate 12 to overlie the surfaces of active regions 14 previously diffused into the substrate surface 13. The deposition of this oxide layer is to a thickness equal to the desired length (height) of the chalcogenide memory elements 28.

Figure 3D:
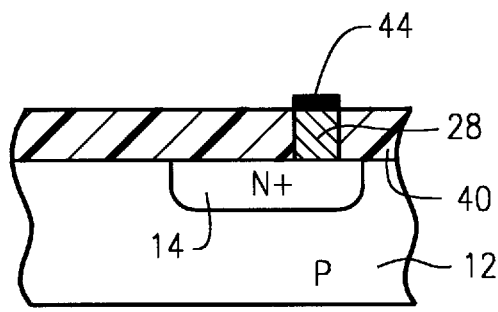
Figure 3B:
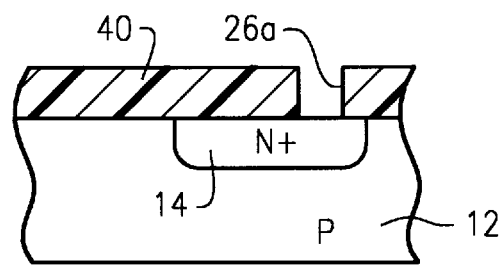
Figure 3E:
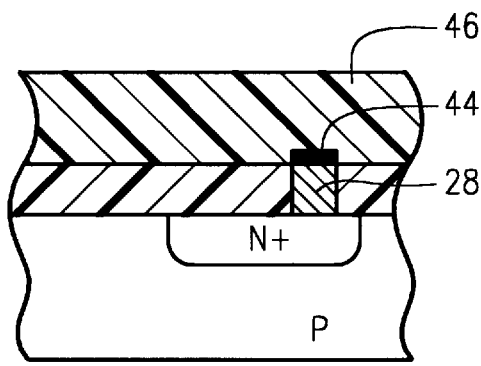
Figure 3C:
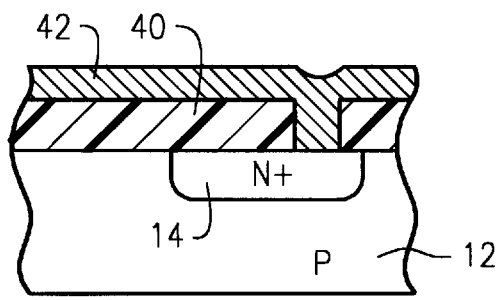

As seen in FIG. 3b, the oxide layer 40 is masked and selectively etched in a conventional manner to create holes 26a corresponding to the lower portions of contact windows 26 in FIG. 1. Then, as illustrated in FIG. 3c, a chalcogenide material layer 42 is deposited over the oxide layer 40 and into holes 26a, such as by a sputtering process. The chalcogenide layer 42 is then removed using a CMP process, leaving the chalcogenide material in holes 26a to constitute memory elements 28 in ohmic contact with active regions 14, as illustrated in FIG. 3d. A suitable electrically conductive protective layer(s) 44, such as a layer of carbon topped by a layer of tin, is then deposited over each chalcogenide memory element 28, and a thick oxide film 46 is grown over oxide layer 40 and protective layer(s) 44, as illustrated in FIG. 3e.

Figure 3F:
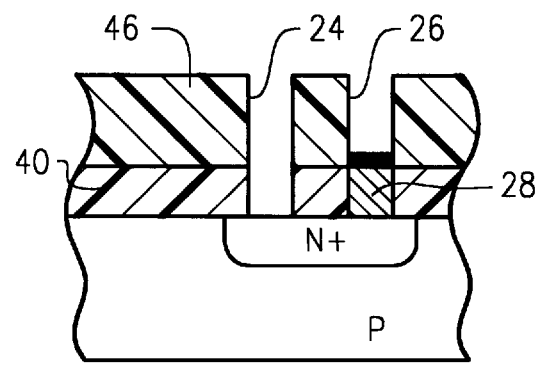
Figure 3G:
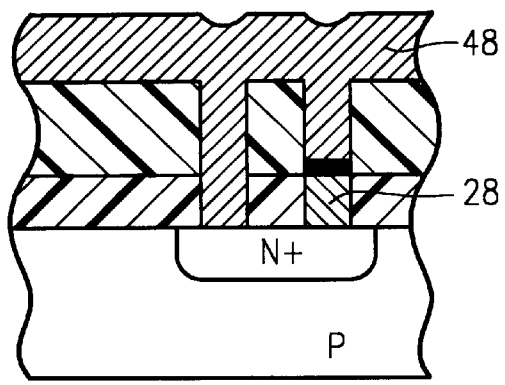
Figure 3I:
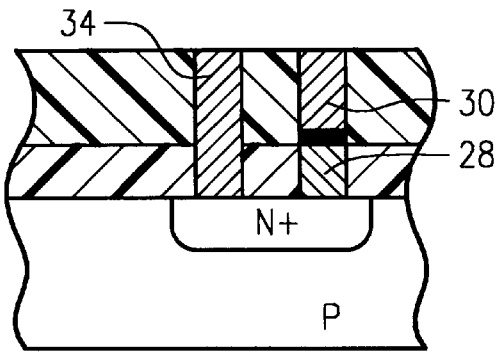
Figure 3H:
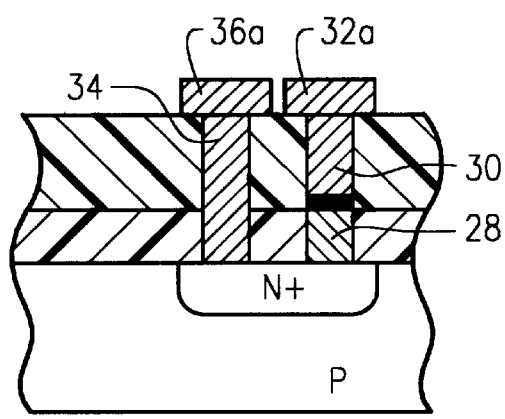
Figure 3J:
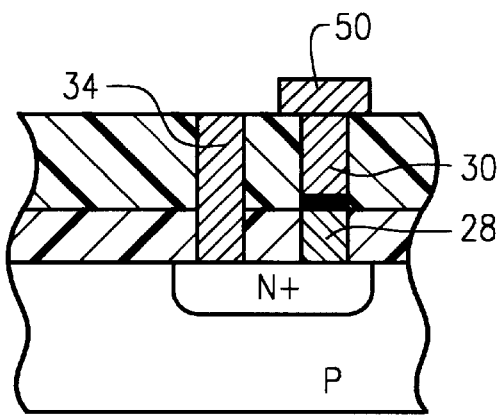

Oxide layer 46 is then masked and selectively etched to create contact windows 24 and 26, as illustrated in FIG. 3f. Then, as seen in FIG. 3g, an appropriate electrode wiring material layer 48, such as aluminum or an aluminum-copper alloy, is sputter-deposited over oxide layer 46 and into contact windows 24 and 26. Electrode wiring layer 48 is then pattern and etched, leaving the contact window deposits in the contact windows to constitute electrodes 30 and 34, as illustrated in FIG. 3h, and interconnections between electrodes to provide branch lines 32a and 36a of metal wirings 32 and 36, respectively, as seen in FIG. 2. It is noted that the memory cell structure of FIG. 3h corresponds to the memory cell structure of FIG. 1.

At this point in the fabrication process, the SRAM has achieved an intermediate product structure conducive to the en masse conditioning of the chalcogenide memory elements 28 by connecting the metal wirings 32 and 36 to source 38, as described above in conjunction with FIG. 2. Once this conditioning step is completed, metal wirings 32 and 36 are removed by a CMP or etching process, as illustrated in FIG. 3i, and the remaining steps in the fabrication process are then performed to produce a SRAM final product, including the patterned deposition of memory cell access circuit lines, one being illustrated at 50 in FIG. 3j in electrical connection with electrode 30.

While the present invention has been described in its application to conditioning chalcogenide memory elements during an SRAM fabrication process, it will be appreciated by those skilled in the semiconductor art that the principles of the invention may have applications in fabrication processes involving other types of semiconductor devices that require some form of electrical conditioning of integrated circuit elements thereof.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An intermediate semiconductor product in a semiconductor fabrication process, comprising:
    a semiconductor substrate; and
    an array of memory cells, each memory cell including:
        an access device having an active semiconductor region with a doped region formed in the substrate; and
        a memory element positioned in ohmic contact with the doped region;
        a first wiring commonly connected to the memory element of each memory cell and connectable with a current source; and
        second wiring commonly connected to the access device doped region of each memory cell and connectable with the current source to produce conditioning current flow in parallel through the memory elements to concurrently condition a programmable memory characteristic of the memory elements,
    wherein each memory element is a resistor comprised of chalcogenide material and is capable of being programmed to either one of first and second stable resistance states, the first stable state being more resistive than the second stable state, and
    wherein each access device is a MOS transistor having a channel that is bypassed by the conditioning current.

2. A final semiconductor product, comprising:
    a semiconductor substrate; and
    an array of memory cells, each memory cell including an access device having an active semiconductor region with a doped region formed in the substrate and a conditioned chalcogenide memory element positioned in ohmic contact with the doped region,
    wherein each access device is a MOS transistor having a channel that is bypassed by a conditioning current used to condition said conditioned chalcogenide memory element.

3. The final semiconductor product defined in claim 2, wherein the final semiconductor product is a Static Random Access Memory (SRAM).

4. A final semiconductor product, comprising:
    a semiconductor substrate; and
    an array of memory cells, each memory cell including an access device having an active semiconductor region with a doped region formed in the substrate and a conditioned resistor capable of being programmed to either one of first and second stable resistance states, the first state being more resistive than the second stable state, the resistor positioned in ohmic contact with the doped region,
    wherein each access device is a MOS transistor having a channel that is bypassed by a conditioning current used to condition said conditioned resistor.

5. The final semiconductor product defined in claim 4, wherein the final semiconductor product is a Static Random Access Memory (SRAM).

6. A semiconductor integrated circuit, comprising:
    a substrate having a primary surface;
    an insulative layer on the substrate primary surface;
    a array of memory cells, each including:
        a pair of first and second contact windows in the insulative layer;
        an access device having an active semiconductor region with a doped region formed in the substrate surface; and
        a memory element positioned in the first contact window in ohmic contact with the doped region;
        a first electrode positioned in the first contact window in electrical connection with the memory element,
        a second electrode positioned in the second contact window in ohmic contact with the doped region,
        a first wiring commonly electrically contacting the first electrode of each memory cell and connectable with a current source; and
        second wiring electrically contacting the second electrode of each memory cell and connectable with the current source to produce conditioning current flow in parallel through the memory elements to concurrently condition a programmable memory characteristic of the memory elements.

7. The integrated circuit defined in claim 6, wherein each memory element is a resistor capable of being programmed to either one of high and low stable resistance states, the first stable state being more resistive than the second stable state.

8. The integrated circuit defined in claim 7, wherein the memory element resistor is comprised of a chalcogenide material.

9. The integrated circuit defined in claim 8, wherein each access device is a MOS transistor having a channel that is bypassed by the conditioning current.

10. An intermediate semiconductor product, comprising:
a semiconductor substrate;
an array of memory cells, each memory cell including:
- an access device having an active semiconductor region with a doped region formed in the substrate; and
- a conditioned memory element positioned in ohmic contact with the doped region;

a first wiring commonly connected to the conditioned memory element of each memory cell and connectable with a current source;

a second wiring commonly connected to the access device doped region of each memory cell and connectable with the current source;

an insulative layer on the semiconductor substrate;

each of the memory cells further including a pair of first and second contact windows in the insulative layer, the conditioned memory elements of each cell being positioned in the first contact window;

a first electrode positioned in each first contact window and being in electrical connection with the conditioned memory element and electrically contacting the first wiring; and a second electrode positioned in each second contact window and being in ohmic contact with the doped region and electrically contacting the second wiring.

* * * * *

UNITED STATES PATENT AND TRADEMARK OFFICE
CERTIFICATE OF CORRECTION

PATENT NO. : 5,949,088            Page 1 of 1
DATED : September 7, 1999
INVENTOR(S) : Donald M. Morgan It is certified that error appears in the above-identified patent and that said Letters Patent is hereby corrected as shown below:

Column 1,
Line 8, insert -- GOVERNMENT RIGHTS
This invention was made with United States Government support under contract No. DABT63-97-C-0001 awarded by the Advance Research Projects Agency (ARPA). The United States Government has certain rights in this invention. --

Signed and Sealed this

Twenty fifth Day of September, 2001

Attest:

*Nicholas P. Godici*

NICHOLAS P. GODICI
*Attesting Officer*      *Acting Director of the United States Patent and Trademark Office*